United States Patent
Yi et al.

(10) Patent No.: US 9,437,270 B2
(45) Date of Patent: Sep. 6, 2016

(54) NONVOLATILE MEMORY APPARATUS FOR CONTROLLING A VOLTAGE LEVEL OF ENABLING A LOCAL SWITCH

(71) Applicant: SK HYNIX INC., Icheon (KR)

(72) Inventors: Jae Yun Yi, Icheon (KR); Seok Pyo Song, Icheon (KR)

(73) Assignee: SK HYNIX INC., Icheon (KR)

( * ) Notice: Subject to any disclaimer, the term of this patent is extended or adjusted under 35 U.S.C. 154(b) by 183 days.

(21) Appl. No.: 14/012,059

(22) Filed: Aug. 28, 2013

(65) Prior Publication Data

US 2014/0293684 A1 Oct. 2, 2014

(30) Foreign Application Priority Data

Apr. 1, 2013 (KR) .................. 10-2013-0035050

(51) Int. Cl.
*G11C 11/16* (2006.01)
(52) U.S. Cl.
CPC .......... *G11C 11/1653* (2013.01); *G11C 11/165* (2013.01); *G11C 11/1655* (2013.01); *G11C 11/1657* (2013.01)
(58) Field of Classification Search
CPC ............ G11C 11/165; G11C 11/1653; G11C 11/1655; G11C 11/1657
See application file for complete search history.

(56) References Cited

U.S. PATENT DOCUMENTS

| 5,521,864 | A  | * | 5/1996  | Kobayashi | ....... | G11C 29/50004 |
|           |    |   |         |           |         | 365/185.12    |
| 2004/0114438 | A1 | * | 6/2004 | Morimoto | ................ | 365/185.29 |
| 2009/0059651 | A1 | * | 3/2009 | Aoki     | .................. | G11C 13/0007 |
|              |    |   |        |          |         | 365/148 |
| 2009/0273961 | A1 | * | 11/2009 | Ono     | ......................... | G11C 7/18 |
|              |    |   |         |         |         | 365/51 |
| 2011/0002162 | A1 | * | 1/2011  | Yang    | ............................. | 365/171 |
| 2011/0267874 | A1 | * | 11/2011 | Ryu     | ........................ | G11C 11/16 |
|              |    |   |         |         |         | 365/158 |

FOREIGN PATENT DOCUMENTS

KR    10-0574489 B1    4/2006

* cited by examiner

*Primary Examiner* — J. H. Hur

(57) ABSTRACT

A nonvolatile memory apparatus includes: a memory cell coupled to a bit line and a source line; a word line configured to select the memory cell; and a local switch block configured to apply a write voltage, a read voltage, and a source line voltage to the bit line and the source line in response to a local switch select signal. In a write or read operation of the nonvolatile memory apparatus, the word line has a first voltage level, and the local switch select signal has a second voltage level higher than the first voltage level.

18 Claims, 5 Drawing Sheets

NONVOLATILE MEMORY APPARATUS FOR CONTROLLING A VOLTAGE LEVEL OF ENABLING A LOCAL SWITCH

CROSS-REFERENCE TO RELATED APPLICATION

The present application claims priority under 35 U.S.C. §119(a) to Korean application number 10-2013-0035050, filed on Apr. 1, 2013, in the Korean Intellectual Property Office, which is incorporated by reference herein in its entirety.

BACKGROUND

1. Technical Field

Various embodiments relate to a semiconductor memory apparatus, and more particularly, to a nonvolatile memory apparatus.

2. Related Art

Dynamic Random Access Memory (DRAM) has advantages of high operating speed and low power consumption, but has a disadvantage of its volatile characteristic (i.e., losing information stored therein when power supply is cut off). On the other hand, Flash memory has advantages of its non-volatile characteristic (i.e., retaining information stored therein even though power supply is cut off), smaller size than a typical hard disk, and high resistance to physical impact, but has disadvantages of lower operating speed and higher power consumption than DRAM.

Recently, a variety of next-generation memory devices having the advantages of DRAM and Flash memory have been developed, and such devices may include a magnetic memory. The magnetic memory uses a resistance change resulting from a polarity change of a magnetic material to store a digital signal. Since the magnetic memory uses magnetism, the magnetic memory has excellent stability.

The magnetic memory generally includes a bit line, a word line, and a digit line parallel to the word line, and writes data using the vector sum of magnetic fields generated when currents flow through the bit line and the digit line at the same time. Since the magnetic memory includes the digit line in addition to the bit and word lines, the magnetic memory has a limitation in reducing a size of its memory cells. Furthermore, when one memory cell is selected to write data, some of the unselected cells may also be exposed to the magnetic fields generated to write the data in the selected memory cell. Thus, the data storage states of the unselected cells may be changed.

In order to solve the above-described issues, a spin transfer torque magnetoresistive random access memory (STT-MRAM) using a spin transfer torque (STT) phenomenon has been developed. The STT phenomenon occurs when a high-density current flows into a ferromagnetic substance whose magnetization direction does not coincide with the spin direction of the current. As a result, the magnetization direction of the ferromagnetic substance may be aligned with the spin direction of the current. A memory cell of the STT-MRAM typically includes one select transistor and one magnetic tunnel junction (MTJ) element, both of which are coupled between a bit line and a source line.

FIG. 1 illustrates an example of an MTJ element 10 applied to a conventional STT-MRAM. Referring to FIG. 1, the MTJ element 10 includes a first electrode layer as a top electrode, a second electrode layer as a bottom electrode, a pair of magnetic layers including a first ferromagnetic layer and a second ferromagnetic layer, and a tunneling barrier layer formed between the pair of magnetic layers.

The first ferromagnetic layer may include a free ferromagnetic layer of which the magnetization direction changes according to a direction of a current flowing through the MTJ element 10. The second ferromagnetic layer may include a pinned ferromagnetic layer of which the magnetization direction is fixed. A resistance value of the MTJ element 10 changes according to whether the magnetization direction of the free ferromagnetic layer is parallel or anti-parallel to that of the pinned ferromagnetic layer. Using such a change in the resistance of the MTJ element 10 according to the direction of the current, data 0 or 1 is written in the MTJ element 10.

FIGS. 2A and 2B are diagrams for explaining how data corresponding to logic low and high levels are written to the MTJ element 10, respectively. FIG. 2A is a diagram for explaining how the logic low level (e.g., data "0") is written to the MTJ element 10. When the data "0" is written in a memory cell including a cell transistor CT and the MTJ element 10, a corresponding word line WL is enabled to turn on the cell transistor CT. Then, when a current flows in the direction from a bit line BL to a source line SL, (i.e., from the first electrode layer as the top electrode to the second electrode layer as the bottom electrode of the MTJ element 10, as indicated by the arrow in FIG. 2A), the magnetization direction of the first ferromagnetic layer (i.e., a free ferromagnetic layer) and that of the second ferromagnetic layer (i.e., a pinned ferromagnetic layer) become parallel. As a result, the MTJ element 10 has a low-resistance state, which corresponds to the logic low level.

FIG. 2B is a diagram for explaining how the logic high level (i.e., data "1") is written to the MTJ element 10. Similarly, the corresponding word line WL is enabled to turn on the cell transistor CT. Furthermore, when a current flows in the direction from the source line SL to the bit line BL (i.e., from the second electrode layer to the first electrode layer, as indicated by the arrow in FIG. 2B), the magnetization direction of the first ferromagnetic layer and that of the second ferromagnetic layer become anti-parallel. As a result, the MTJ element 10 has a high resistance state, which corresponds to the logic high level.

SUMMARY

A nonvolatile memory apparatus capable of separating a voltage which is provided through a word line from a voltage for controlling a local switch is described herein.

In an embodiment, a nonvolatile memory apparatus includes: a memory cell coupled to a bit line and a source line; a word line configured to select the memory cell; and a local switch block configured to apply a write voltage, a read voltage, and a source line voltage to the bit line and the source line in response to a local switch select signal. The word line is enabled to have a first voltage level, and the local switch select signal is enabled to have a second voltage level higher than the first voltage level.

In an embodiment, a nonvolatile memory apparatus comprising: a memory cell coupled to a bit line and a source line; a word line configured to select the memory cell; a first local switch block configured to provide a write voltage, a read voltage, and a source line voltage to the bit line in response to a first local switch select signal; and a second local switch block configured to provide the write voltage and the source line voltage to the source line in response to a second local switch select signal. The first and second local switch select signals have different voltage levels.

In an embodiment, a nonvolatile memory apparatus comprising: a variable resistor having one end coupled to a bit line; a cell transistor having one end coupled to the other end of the variable resistor, the other end coupled to a source line, and a gate coupled to a word line; a first local switch configured to apply a write voltage, a read voltage, and a source line voltage to the bit line in response to a first local switch select signal; and a second local switch configured to apply the write voltage and the source line voltage to the source line in response to a second local switch select signal. The first and second local switch select signals are enabled to have different levels.

BRIEF DESCRIPTION OF THE DRAWINGS

Features, aspects, and embodiments are described in conjunction with the attached drawings, in which.

DETAILED DESCRIPTION

Hereinafter, a nonvolatile memory apparatus according to the present disclosure will be described below with reference to the accompanying drawings through embodiments.

Figure 1:
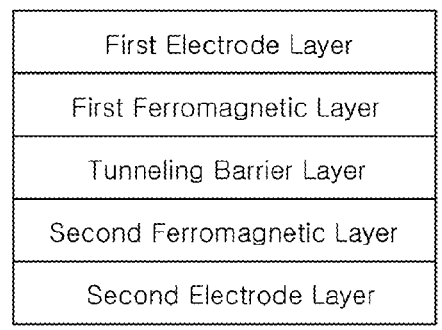
FIG. 1 illustrates an example of an MTJ element applied to a conventional STT-MRAM.
Figure 2A:
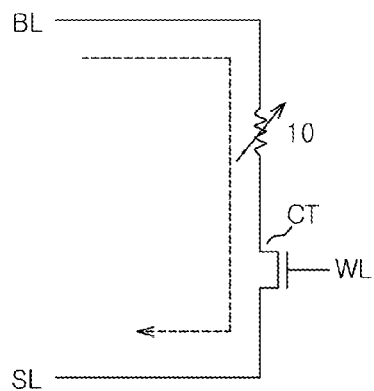
FIGS. 2A and 2B are diagrams for explaining how data are written to the MTJ element.
Figure 2B:
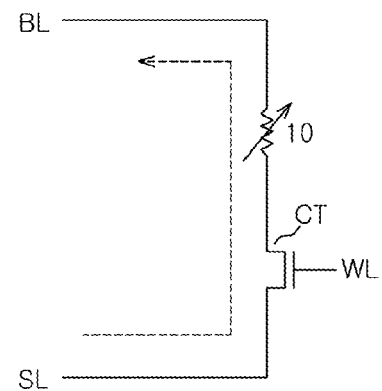
Figure 3:
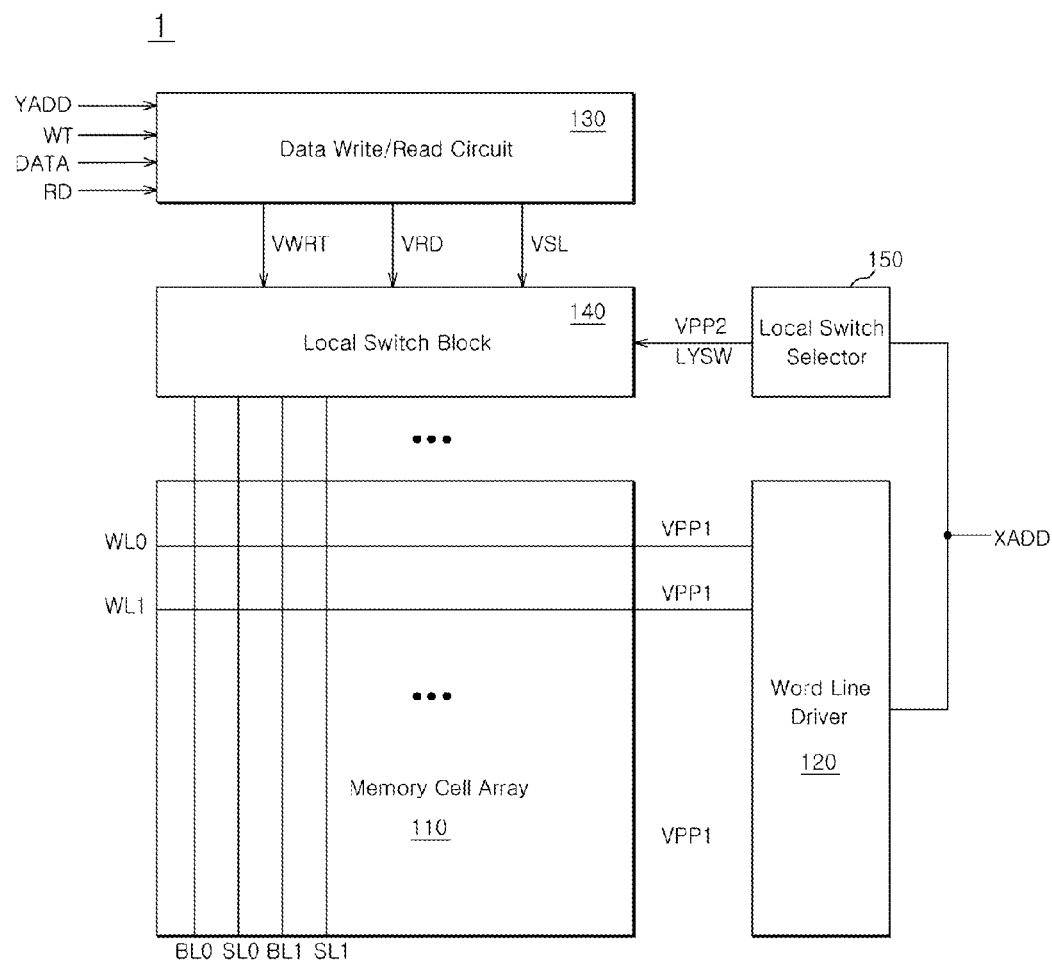
FIG. 3 schematically illustrates a configuration of a nonvolatile memory apparatus according to an embodiment.

Referring to FIG. 3, a nonvolatile memory apparatus 1 includes a memory cell array 110, a word line driver 120, a data write/read circuit 130, a local switch block 140, and a local switch selector 150. The memory cell array 110 includes a plurality of memory cells which are electrically coupled to word lines WL0 and WL1, bit lines BL0 and BL1, and source lines SL0 and SL1 at the intersections between the word lines WL0 and WL1 and the bit line BL0 and BL1. The memory cell may include a variable resistor of which the resistance varies according to a direction of a current flowing through the variable resistor.

The word line driver 120 is configured to select the word lines WL0 and WL1 coupled to a memory cell corresponding to a row address signal XADD. The selected word lines WL0 and WL1 may have a first voltage level VPP1. In an embodiment, the first voltage level VPP1 may include a pumping voltage or boosting voltage generated inside the nonvolatile memory apparatus 1.

The data write/read circuit 130 is configured to provide a write voltage VWRT, a read voltage VRD, and a source line voltage VSL, in order to write data to a memory cell or read data stored in a memory cell. In a write operation, the data write/read circuit 130 may provide the write voltage VWRT and the source line voltage VSL to the local switch block 140 in response to a column address signal YADD, a write signal WT, and data DATA. In a read operation, the data write/read circuit 130 may provide the read voltage VRD and the source line voltage VSL to the local switch block 140 in response to the column address signal YADD and a read signal RD. In this embodiment, the level of the write voltage VWRT may be higher than the level of the read voltage VRD, and the level of the read voltage VRD may also be higher than the source line voltage VSL.

The local switch block 140 is configured to receive the write voltage VWRT, the read voltage VRD, and the source line voltage VSL from the data write/read circuit 130. The local switch block 140 provides at least one of the write voltage VWRT, the read voltage VRD, and the source line voltage VSL to one of the bit lines BL0 and BL1 in response to a local switch select signal LYSW. The local switch block 140 also provides at least one of the write voltage VWRT and the source line voltage VSL to one of the source lines SL0 and SL1 in response to a local switch select signal LYSW. In an embodiment, since the nonvolatile memory apparatus 1 includes numerous bit lines and source lines, a specific number of bit lines and a specific number of source lines are combined and controlled as a global bit line and a global source line, respectively. Thus, the data write/read circuit 130 may provide at least one of the write voltage VWRT, the read voltage VSL, and the source line voltage VSL to a specific global bit line according to the column address signal YADD, the write signal WT, the data DATA, and the read signal RD. The data write/read circuit 130 may also provide one of the write voltage VWRT and the source line voltage VSL to a specific global source line. The local switch block 140 may provide one of the write voltage VWRT, the read voltage VRD, and the source line voltage VSL to a specific bit line according to the column address signal YADD. The local switch block 140 may also provide one of the write voltage VWRT and the source line voltage VSL to a specific source line according to the column address signal YADD.

The data write/read circuit 130 may change a direction of a current flowing through a memory cell depending on data to be written to the memory cell. For example, when first data (e.g., logic low level) is to be written to the memory cell, the data write/read circuit 130 may apply the write voltage VWRT to the global bit line and the source line voltage VSL to the global source line. In this case the local switch block 140 may provide the write voltage VWRT to a specific bit line, and provide the source line voltage VSL to a specific source line. On the other hand, when second data (e.g., logic high level) is to be written to the memory cell, the data write/read circuit 130 may apply the source line voltage VSL to the global bit line and the write voltage VWRT to the global source line. In this case the local switch block 140 may provide the source line voltage VSL to the specific bit line, and may provide the write voltage VWRT to the specific source line.

The local switch selector 150 is configured to generate the local switch select signal LYSW. The local switch selector 150 may generate the local switch select signal LYSW based on the row address signal XADD. The local switch selector 150 generates the local switch select signal LYSW having a second voltage level VPP2. That is, the local switch select signal LYSW has the second voltage level VPP2. In an embodiment, the second voltage level VPP2 may be higher than the first voltage level VPP1. Thus, when the first voltage level VPP1 corresponds to a pumping voltage or boosting voltage, the local switch select signal LYSW may have a higher level than the pumping voltage or boosting voltage.

When the row address signal XADD, the column address signal YADD, the write signal WT, and the data DATA are applied for a write operation of the nonvolatile memory apparatus 1, the word line driver 120 enables a specific word line to have the first voltage level VPP1 based on the row address XADD.

The data write/read circuit 130 selects a specific global bit line and a specific global source line in response to the column address signal YADD. The data write/read circuit 130 supplies the write voltage VWRT and the source line voltage VSL to the selected global bit line and the selected global source line in response to the write signal WT and the data DATA.

The local switch selector 150 generates the local switch select signal LYSW having the second voltage level VPP2 to turn on the local switch block 140, in response to the row address signal XADD. Thus, the local switch block 140 may provide the write voltage VWRT and the source line voltage VSL to a specific bit line and a specific source line coupled to a memory cell to which data is to be written. For instance, the memory cell may receive the write voltage VWRT and the source line voltage VSL through the bit line and the source line, respectively. In this case, a current flows from the bit line to the source line through the memory cell, and data having a logic low level is written to the memory cell. On the other hand, the memory cell may receive the write voltage VWRT and the source line voltage VSL through the source line and the bit line, respectively. In this case, a current flows from the source line to the bit line through the memory cell, and data having a logic high level is written to the memory cell. Therefore, the memory cell may store different data according to the direction of the current flowing through the memory cell.

During a read operation of the nonvolatile memory apparatus 1, the data write/read circuit 130 may select a specific global bit line and a specific source line in response to the column address signal YADD. In an embodiment, the data write/read circuit 130 may provide the read voltage VRD and the source line voltage VSL to the selected specific global bit line and the selected specific global source line, respectively, in response to the read signal RD. The local switch selector 150 enables the local switch select signal LYSW to turn on the local switch block 140. Thus, the local switch block 140 may apply the read voltage VRD and the source line voltage VSL to a specific bit line and a specific source line, respectively. The word line driver 120 selects a specific word line corresponding to the row address signal XADD. A memory cell selected by the word line and coupled to the bit line and the source line receives the read voltage VRD through the bit line, and receives the source line voltage VSL through the source line. Therefore, a current of which the direction is varied according to the data stored in the memory cell may flow from the bit line to the source line through the memory cell, and the write/read circuit 130 may receive the current flowing through the memory cell to read the data stored in the memory cell.

Figure 4:
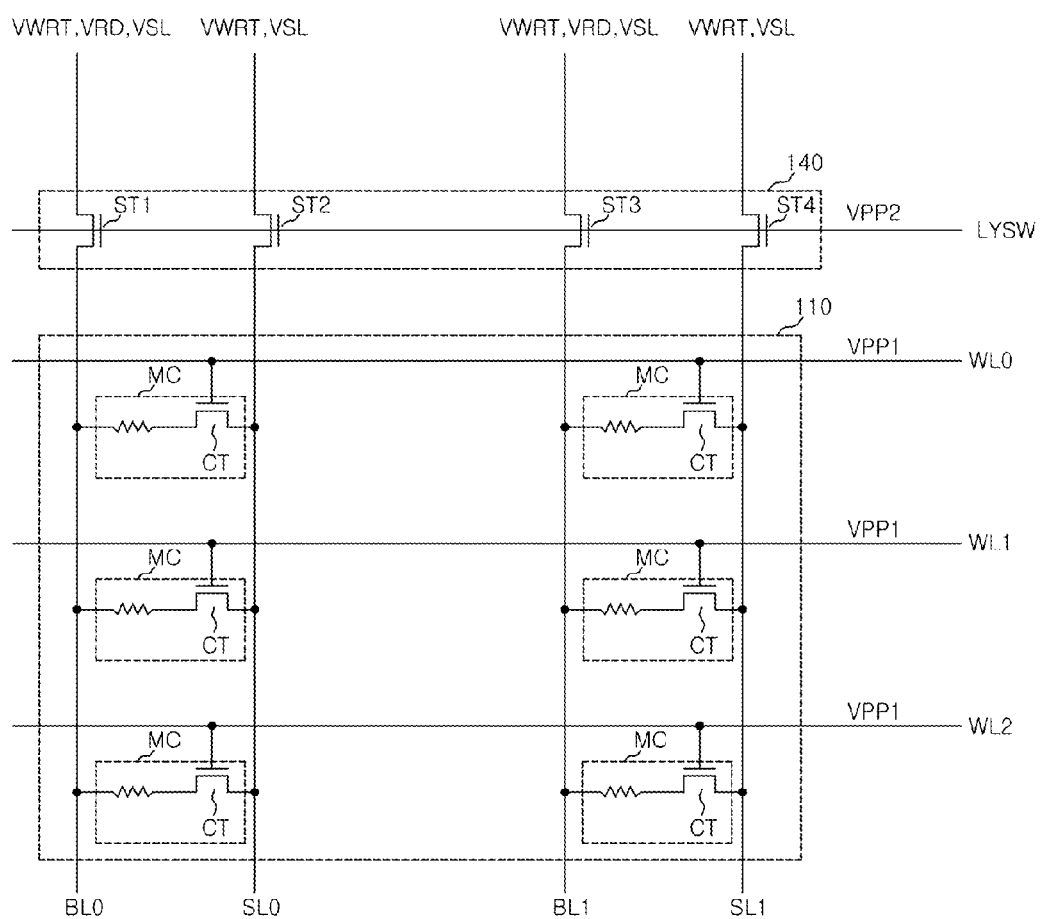
FIG. 4 is a detailed configuration diagram of the nonvolatile memory apparatus of FIG. 3.

FIG. 4 is a detailed configuration diagram of the nonvolatile memory apparatus 1 of FIG. 3. FIG. 4 illustrates the memory cell array 110 and the local switch block 140. The memory cell array 110 includes a plurality of memory cells MC, a plurality of word lines WL0, WL1, and WL2, a plurality of bit lines BL0 and BL1, and a plurality of source lines SL0 and SL1. The plurality of memory cells MC are coupled to the bit lines BL0 and BL1 and the source lines SL0 and SL1. Each of the memory cells MC includes a variable resistor and a cell transistor CT. The variable resistor has one end coupled to the bit line BL0 or BL1 and the other end coupled to one end of the cell transistor CT. The cell transistor CT has the other end coupled to the source line SL0 or SL1 and a gate coupled to the word line WL0, WL1, or WL2.

In FIG. 4, the local switch block 140 includes first to fourth switch transistors ST1, ST2, ST3, and ST4. The first switch transistor ST1 is configured to provide at least one of a write voltage VWRT, a read voltage VRD, and a source line voltage VSL to the first bit line BL0 in response to the local switch select signal LYSW. The first switch transistor ST1 has one end configured to receive at least one of the write voltage VWRT, the read voltage VRD, and the source line voltage VSL, the other end coupled to the first bit line BL0, and a gate configured to receive the local switch select signal LYSW. The second switch transistor ST2 is configured to provide at least one of the write voltage VWRT and the source line voltage VSL to the first source line SL0 in response to the local switch select signal LYSW. The second switch transistor ST2 has one end configured to receive at least one of the write voltage VWRT and the source line voltage VSL, the other end coupled to the first source line SL0, and a gate configured to receive the local switch select signal LYSW. The third switch transistor ST3 is configured to provide at least one of one of the write voltage VWRT, the read voltage VRD, and the source line voltage VSL to the second bit line BL1 in response to the local switch select signal LYSW. The third switch transistor ST3 has one end configured to receive at least one of the write voltage VWRT, the read voltage VRD, and the source line voltage VSL, the other end coupled to the second bit line BL1, and a gate configured to receive the local switch select signal LYSW. The fourth switch transistor ST4 is configured to provide at least one of the write voltage VWRT and the source line voltage VSL to the second source line SL1 in response to the local switch select signal LYSW. The fourth switch transistor ST4 has one end configured to receive at least one of the write voltage VWRT and the source line voltage VSL, the other end coupled to the second source line SL1, and a gate configured to receive the local switch select signal LYSW.

When the nonvolatile memory apparatus 1 writes data to the memory cell, the nonvolatile memory apparatus 1 may provide the write voltage VWRT and the source line voltage VSL to the bit line BL0 or BL1 and the source line SL0 or SL1, respectively. In this case, a current flows from the bit line BL0 or BL1 to the source line SL0 or SL1. Alternatively, the nonvolatile memory apparatus 1 may provide the write voltage VWRT and the source line voltage VSL to the source line SL0 or SL1 and the bit line BL0 or BL1, respectively. In this case, a current flows from the source line SL0 or SL1 to the bit line BL0 or BL1. Since a magnetization direction of a free magnetic layer in the variable resistor may be changed according to the direction of the current flowing through the memory cell MC, a resistance value of the memory cell MC may be changed according to the direction of the current. In an embodiment, in order to provide an accurate level of the current to the memory cell MC, the cell transistor CT may be controlled to operate in a saturation region. In order to operate the transistor CT in the saturation region, the level of the gate voltage (i.e., the first voltage level VPP1) applied to the transistor CT may be adjusted. For example, when the transistor CT is an NMOS transistor, the level of the applied gate voltage VPP1 may be decreased to ensure that the transistor CT operates in the saturation region. However, the level of the write voltage or read voltage applied through the switch transistors may be decreased as the level of the local switch select signal LYSW is decreased. It causes an incorrect data to be written to the memory cell MC or to be read from the memory cell MC.

The nonvolatile memory apparatus 1 according to an embodiment distinguishes the voltage level (i.e., the first voltage level VPP1) applied to the gate of the cell transistor CT through the word lines WL0 to WL2 from the voltage level (i.e., the second voltage level VPP2) applied to the gates of the switch transistors ST1 to ST4 by enabling the local switch select signal LYSW. The word lines WL0 to WL2 to control the gate of the cell transistor CT may be enabled to have the first voltage level VPP1 to operate the cell transistor CT in the saturation region. The gates of the switch transistors ST1 to ST4 may be controlled through the local switch select signal LYSW enabled to have the second voltage level VPP2. For example, the second voltage level VPP2 may be higher than the first voltage level VPP1 so that the write voltage VWRT provided from the data write/read circuit 130 is provided to the bit lines BL0 and BL1 or the source lines SL0 and SL1 without a significant loss.

Figure 5:
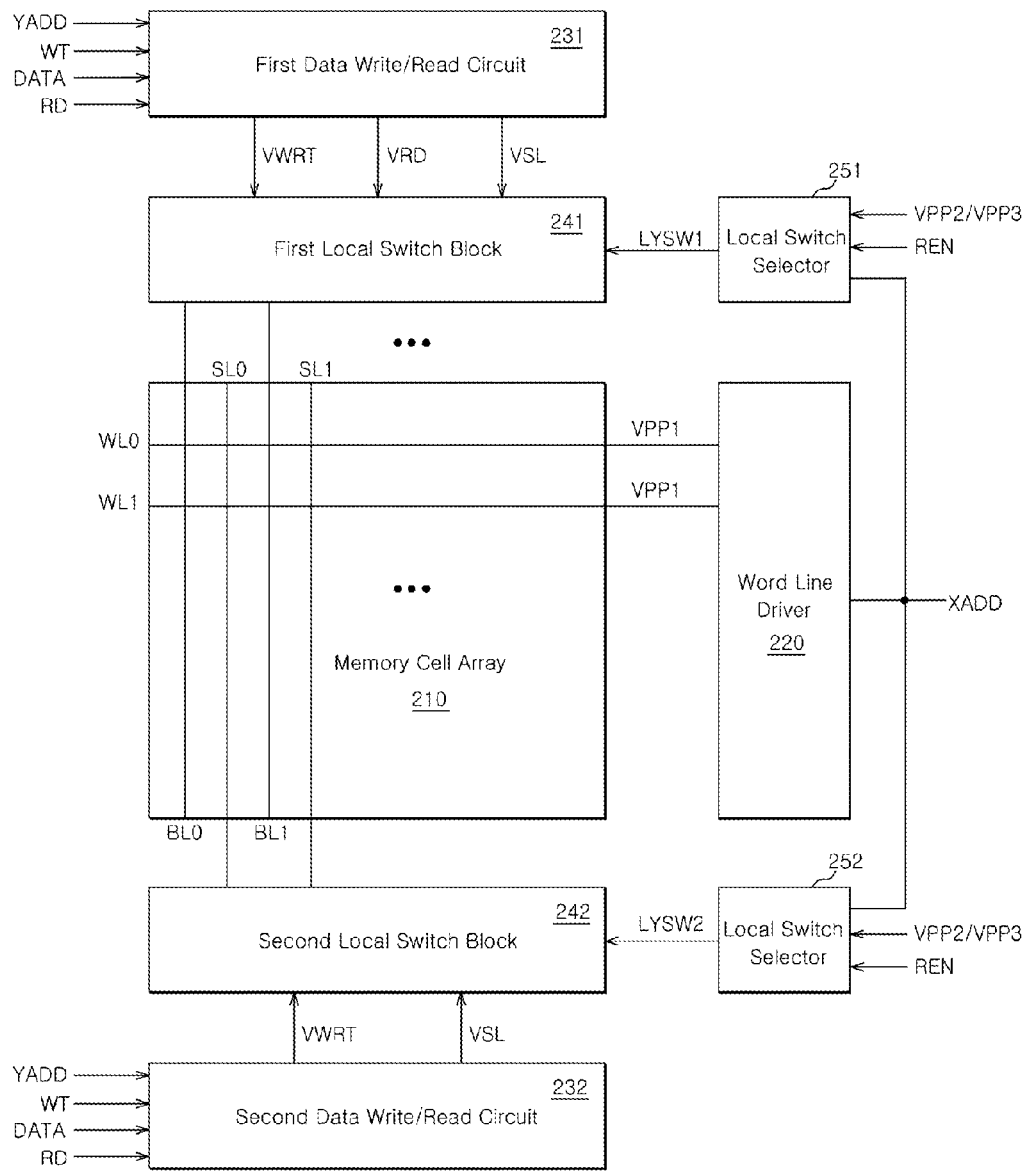
FIG. 5 schematically illustrates a configuration of a nonvolatile memory apparatus according to an embodiment.

FIG. 5 is a block diagram schematically illustrating the configuration of a nonvolatile memory apparatus 2 according to another embodiment. In FIG. 5, the nonvolatile memory apparatus 2 includes a memory cell array 210, a word line driver 220, first and second data write/read circuits 231 and 232, first and second local switch blocks 241 and 242, and first and second local switch selectors 251 and 252. The memory cell array 210 includes a plurality of memory cells electrically coupled to word lines WL0 and WL1, bit lines BL0 and BL1, and source lines SL0 and SL1 at the intersections between the word lines WL0 and WL1 and the bit lines BL0 and BL1.

The word line driver 220 is configured to select the word lines WL0 and WL1 coupled to a memory cell to be accessed, according to a row address signal XADD. The word line driver 220 enables the word lines WL0 and WL1 to have a first voltage level VPP1. For example, the first voltage level VPP1 may include a pumping voltage or boosting voltage generated inside the nonvolatile memory apparatus 2.

The first and second data write/read circuits 231 and 232 are configured to provide a write voltage VWRT, a read voltage VRD, and a source line voltage VSL to write data to a memory cell or read data stored in a memory cell. The first data write/read circuit 231 may provide the write voltage VWRT, the read voltage VRD, and the source line voltage VSL to the first local switch block 241 in response to a column address signal YADD, a write signal WT, data DATA, and a read signal RD. The second data write/read circuit 232 may provide the write voltage VWRT and the source line voltage VSL to the second local switch block 242 in response to the column address signal YADD, the write signal WT, and the data DATA, and the read signal RD. The first and second data write/read circuits 231 and 232 may have the substantially same configuration as the data write/read circuit 130 of FIG. 3 and operate in substantially the same manner. In FIG. 5, however, the first data write/read circuit 231 and the second data write/read circuit 232 are separated from each other, and disposed over and under the memory cell array 210.

The first local switch block 241 is configured to receive the write voltage VWRT, the read voltage VRD, and the source line voltage VSL from the first data write/read circuit 231. The first local switch block 241 may provide the write voltage VWRT, the read voltage VRD, and the source line voltage VSL to the bit lines BL0 and BL1 in response to a first local switch select signal LYSW1. The first local switch signal LYSW1 may have one of second and third voltage levels VPP2 and VPP3. In an embodiment, the first local switch signal LYSW1 may have the second voltage level VPP2 when the first local switch block 241 provides the write voltage VWRT and the read voltage VRD to the bit lines BL0 and BL1. The first local switch signal LYSW1 may have the third voltage level VPP3 when the first local switch block 241 provides the source line voltage VSL to the bit lines BL0 and BL1. In this embodiment, the second voltage level VPP2 may be equal to or higher than the third voltage level VPP3, and the third voltage level VPP3 may be equal to or higher than the first voltage level VPP1.

The second local switch block 242 is configured to receive the write voltage VWRT and the source line voltage VSL from the second data write/read circuit 232. The second local switch block 242 may provide the write voltage VWRT and the source line voltage VSL to the source lines SL0 and SL1 in response to a second local switch select signal LYSW2. The second local switch signal LYSW2 may have one of the second and third voltage levels. In an embodiment, the second local switch signal LYSW2 may have the second voltage level VPP2 when the second local switch block 242 provides the write voltage VWRT to the source lines SL0 and SL1. The second local switch signal LYSW2 may have the third voltage level VPP3 when the second local switch block 242 provides the source line voltage VSL to the source lines SL0 and SL1.

The first and second local switch selectors 251 and 252 are configured to generate the first and second local switch signals LYSW1 and LYSW2, respectively. The first and second local switch selectors 251 and 252 may generate the first and second local switch signals LYSW1 and LYSW2 in response to the row address signal XADD and a write select signal REN. In an embodiment, the write select signal REN may be generated inside the first and second data write/read circuits 231 and 232, based on the write signal WT and the data DATA. The write select signal REN is used as a signal for determining which one of the write voltage VWRT and the source line voltage VSL is provided to the bit lines BL0 and BL1 and to the source line SL0 and SL1, respectively. The determination is based on which type of data is written to a memory cell during a write operation.

The first local switch selector 251 is configured to generate the first local switch select signal LYSW1 having the second voltage level VPP2, when the write voltage VWRT and the read voltage VRD are applied from the first data write/read circuit 231 and the first local switch block 241 provides the write voltage VWRT and the read voltage VRD to the bit lines BL0 and BL1. Furthermore, the first local switch selector 251 is configured to generate the first local switch select signal LYSW1 having the third voltage level VPP3, when the source line voltage VSL is applied from the first data write/read circuit 231 and the first local switch block 241 provides the source line voltage VSL to the bit lines BL0 and BL1.

The second local switch selector 252 is configured to generate the second local switch select signal LYSW2 having the second voltage level VPP2, when the write voltage VWRT is applied from the second data write/read circuit 232 and the second local switch block 242 provides the write voltage VWRT to the source lines SL0 and SL1. Furthermore, the second local switch selector 252 is configured to generate the second local switch select signal LYSW2 having the third voltage level VPP3, when the source line voltage VSL is applied to the second data write/read circuit 232 and the second local switch block 242 provides the source line voltage VSL to the source lines SL0 and SL1.

Figure 6:
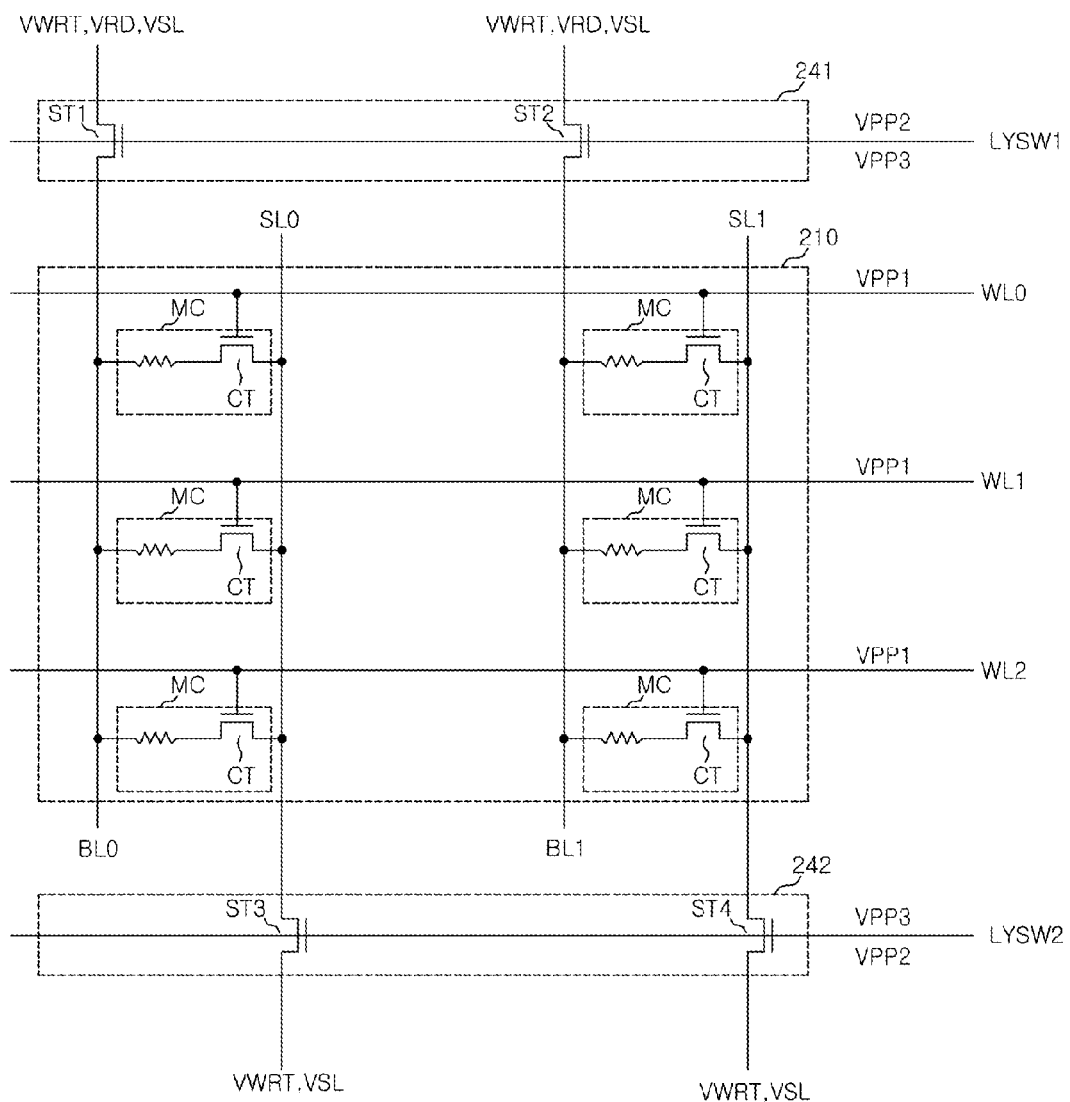
FIG. 6 is a detailed configuration diagram of the nonvolatile memory apparatus of FIG. 5.

FIG. 6 is a detailed configuration diagram of the nonvolatile memory apparatus 2 of FIG. 5. FIG. 6 illustrates the memory cell array 210, the first local switch block 241, and the second local switch block 242. The memory cell array 210 includes a plurality of memory cells MC, a plurality of bit lines BL0 and BL1, a plurality of source lines SL0 and SL1, and a plurality of word lines WL0, WL1, and WL2. The plurality of memory cells MC are coupled to the bit lines BL0 and BL1 and the source lines SL0 and SL1, respectively. Each of the memory cells MC includes a variable resistor and a cell transistor CT. The variable resistor has one end coupled to the bit line BL0 or BL1 and the other end coupled to one end of the cell transistor CT. The cell transistor CT has the other end coupled to the source line SL0 or SL1 and a gate coupled to the word line WL0, WL1 or WL2.

In an embodiment shown in FIG. 6, the first local switch block 241 includes first and second switch transistors ST1 and ST2. The first switch transistor ST1 is configured to provide at least one of a write voltage VWRT, a read voltage VRD, and a source line voltage VSL to the first bit line BL0 in response to the first local switch select signal LYSW1. The first switch transistor ST1 has one end configured to receive at least one of the write voltage VWRT, the read voltage VRD, and the source line voltage VSL, the other end coupled to the first bit line BL0, and a gate configured to receive the first local switch select signal LYSW1. The second switch transistor ST2 is configured to provide at least one of the write voltage VWRT, the read voltage VRD, and the source line voltage VSL to the second bit line BL1 in response to the first local switch select signal LYSW1. The second switch transistor ST2 has one end configured to receive at least one of the write voltage VWRT, the read voltage VRD, and the source line voltage VSL, the other end coupled to the second bit line BL1, and a gate configured to receive the first local switch select signal LYSW1.

The second local switch block 242 includes third and fourth switch transistors ST3 and ST4. The third switch transistor ST3 is configured to provide at least one of the write voltage VWRT and the source line voltage VSL to the first source line SL0 in response to the second local switch select signal LYSW2. The third switch transistor ST3 has one end configured to receive at least one of the write voltage VWRT and the source line voltage VSL, the other end coupled to the first source line SL0, and a gate configured to receive the second local switch select signal LYSW2. The fourth switch transistor ST4 is configured to provide at least one of the write voltage VWRT and the source line voltage VSL to the second source line SL1 in response to the second local switch select signal LYSW2. The fourth switch transistor ST4 has one end configured to receive at least one of the write voltage VWRT and the source line voltage VSL, the other end coupled to the second source line SL1, and a gate configured to receive the second local switch select signal LYSW2.

In this embodiment, the write voltage VWRT and the read voltage VRD have a higher level than the source line voltage VSL. When the switch transistors ST1, ST2, ST3, and ST4 of the first and second local switch blocks 241 and 242 provide the write voltage VWRT or the read voltage VRD, the first and second local switch select signals LYSW1 and LYSW2 having the second voltage level VPP2 may be applied to the gates thereof. In this case, since gate-source voltage differences (Vgs) of the switch transistors ST1, ST2, ST3, and ST4 may be so small that the transistors ST1, ST2, ST3, and ST4 are unlikely to be deteriorated. On the other hand, when the switch transistors ST1, ST2, ST3, and ST4 provide the source line voltage VSL, the first and second local switch select signals LYSW1 and LYSW2 having the second voltage level VPP2 may be applied to the gates thereof. In this case, the gate-source voltage differences Vgs of the switch transistors ST1, ST2, ST3, and ST4 may become so large that the switch transistors ST1, ST2, ST3, and ST4 are likely to be deteriorated. In order to suppress the deterioration, the local switch select signals LYSW1 and LYSW2 may have the third voltage level VPP3 that is lower than the second voltage level VPP2. In this manner, the gate-source voltage differences Vgs of the switch transistors ST1, ST2, ST3, and ST4 become reduced, and thus the switch transistors ST1, ST2, ST3, and ST4 are unlikely to be deteriorated. Thus, in this embodiment, when the first and second local switch blocks 241 and 242 provide the write voltage VWRT or the read voltage VRD, the first and second local switch select signals LYSW1 and LYSW2 may have the second voltage level VPP2. However, when the first and second local switch blocks 241 and 242 provide the source line voltage VSL, the first and second local switch select signals LYSW1 and LYSW2 may have the third voltage level VPP3, which is lower than the second voltage level VPP2.

Referring to FIGS. 5 and 6, the operation of the nonvolatile memory apparatus 2 according to an embodiment will be described as follows. First, for a write or read operation, a specific word line is configured to have the first voltage level VPP1 in response to the row address signal XADD. In the write operation when first data (e.g., logic low level) is to be written, the first data write/read circuit 231 provides the write voltage VWRT to the first local switch block 241. Furthermore, the second data write/read circuit 232 provides the source line voltage VSL to the second local switch block 242. The first local switch selector 251 generates the first local switch select signal LYSW1 having the second voltage level VPP2 in response to the row address signal XADD and the write select signal REN. Furthermore, the second local switch selector 252 generates the second local switch select signal LYSW2 to the third voltage level VPP3 in response to the row address signal XADD and the write select signal REN. Thus, the first local switch block 241 applies the write voltage VWRT to a specific bit line, and the second local switch block 242 applies the source line voltage VSL to a specific source line. As a result, a current flows from the bit line to the source line through a memory cell MC to write the first data (e.g., logic low level). In this manner, the first data may be stored in the memory cell MC coupled to the specific bit line and the specific source line.

In the write operation, when second data (e.g., logic high level) is to be written, the first write/read circuit 231 provides the source line voltage VSL to the first local switch block 241, and the second data/read circuit 232 provides the write voltage VWRT to the second local switch block 242. The first local switch selector 251 generates the first local switch select signal LYSW1 having the third voltage level VPP3 in response to the row address signal XADD and the write select signal REN. Furthermore, the second local switch selector 252 generates the second local switch select signal LYSW2 having the second voltage level VPP2 in response to the row address signal XADD and the write select signal REN. Thus, the first local switch block 241 applies the source line voltage VSL to a specific bit line and the second local switch block 242 applies the write voltage VWRT to a specific source line. As a result, a current flows from the source line to the bit line through a memory cell MC to write the second data (e.g., logic high level). In this manner, the second data may be stored in the memory cell MC coupled to the specific bit line and the specific source line.

In the read operation, the first data write/read circuit 231 provides the read voltage VRD to the first local switch block 241, and the second data write/read circuit 232 provides the source line voltage VSL to the second local switch block

242. The first local switch selector 251 generates the first local switch select signal LYSW1 having the second voltage level VPP2 in response to the row address signal XADD, and the second local switch selector 252 generates the second local switch select signal LYSW2 having the third voltage level VPP3 in response to the row address signal XADD. Thus, the first local switch block 241 applies the read voltage VRD to a specific bit line, and the second local switch block 242 applies the source line voltage VSL to a specific source line. Then, as a current flows from the specific bit line to the specific source line, the data stored in the memory cell MC may be read depending on the resistance state of the memory cell MC.

While certain embodiments have been described above, it will be understood to those skilled in the art that these embodiments have been described for illustrative purposes. Accordingly, the semiconductor memory apparatus described herein should not be limited to the described embodiments. Rather, the semiconductor memory apparatus described herein should be understood in light of the following claims when taken in conjunction with the above description and accompanying drawings.

What is claimed is:

1. A nonvolatile memory apparatus comprising:
  a memory cell coupled to a bit line and a source line;
  a word line configured to select the memory cell;
  a first local switch block configured to provide at least one of a write voltage, a read voltage, and a source line voltage to the bit line in response to a first local switch select signal;
  a second local switch block configured to provide at least one of the write voltage and the source line voltage to the source line in response to a second local switch select signal;
  a first data write/read circuit configured to provide the write voltage, the read voltage, and the source line voltage to the first local switch block in response to a column address signal, a write signal, data, and a read signal; and
  a second data write/read circuit configured to provide the write voltage and the source line voltage to the second local switch block in response to the column address signal, the write signal, the data, and the read signal,
  wherein the first and second local switch select signals are enabled at logic high levels and the first and second local switch select signals are enabled at different voltage levels from each other.

2. The nonvolatile memory apparatus according to claim 1, wherein the word line has a first voltage level, and the first and second local switch select signals have one of second and third voltage levels.

3. The nonvolatile memory apparatus according to claim 2, wherein, when the first local switch block provides the write voltage and the read voltage, the first local switch select signal has the second voltage level, and when the first local switch block provides the source line voltage, the first local switch select signal has the third voltage level.

4. The nonvolatile memory apparatus according to claim 3, wherein the third voltage level is equal to or higher than the first voltage level and lower than the second voltage level.

5. The nonvolatile memory apparatus according to claim 2, further comprising a first local switch selector configured to generate the first local switch select signal having one of the second and third voltage levels based on a row address signal, the write signal, and the data.

6. The nonvolatile memory apparatus according to claim 2, wherein, when the second local switch block provides the write voltage, the second local switch select signal has the second voltage level, and when the second local switch block provides the source line voltage, the second local switch select signal has the third voltage level.

7. The nonvolatile memory apparatus according to claim 6, wherein the third voltage level is equal to or higher than the first voltage level and lower than the second voltage level.

8. The nonvolatile memory apparatus according to claim 2, further comprising a second local switch selector configured to generate the second local switch select signal having one of the second and third voltage levels based on a row address signal, the write signal, and the data.

9. A nonvolatile memory apparatus comprising:
  a variable resistor having a first end coupled to a bit line;
  a cell transistor having a first end coupled to a second end of the variable resistor, a second end of the cell transistor coupled to a source line, and a gate of the cell transistor coupled to a word line;
  a first local switch configured to apply at least one of a write voltage, a read voltage, and a source line voltage to the bit line in response to a first local switch select signal; and
  a second local switch configured to apply at least one of the write voltage and the source line voltage to the source line in response to a second local switch select signal,
  wherein the first and second local switch select signals are enabled at logic high levels and the first and second local switch select signals are enabled at different voltage levels from each other.

10. The nonvolatile memory apparatus according to claim 9, wherein the word line has a first voltage level, the first local switch select signal has one of second and third voltage levels, the second voltage level is higher than the third voltage level, and the third voltage level is equal to or higher than the first voltage level.

11. The nonvolatile memory apparatus according to claim 10, wherein the second local switch select signal has one of the second and third voltage levels.

12. The nonvolatile memory apparatus according to claim 9, further comprising a data write/read circuit configured to provide the write voltage, the read voltage, and the source line voltage to the first local switch, and configured to provide the write voltage and the source line voltage to the second local switch.

13. The nonvolatile memory apparatus according to claim 11, wherein:
  when data having a low level is written to the memory cell, the first local switch applies the write voltage to the bit line and the second local switch applies the source line voltage to the source line; and
  the first local switch select signal has the second voltage level and the second local switch select signal has the third voltage level.

14. The nonvolatile memory apparatus according to claim 11, wherein:
  when data having a high level is written to the memory cell, the first local switch applies the source line voltage to the bit line and the second local switch applies the write voltage to the source line; and
  the first local switch select signal has the third voltage level and the second local switch select signal has the second voltage level.

15. A nonvolatile memory apparatus comprising:
a memory cell coupled to a bit line and a source line;
a word line configured to select the memory cell;
a first local switch block configured to selectively provide a write voltage, a read voltage, and a source line voltage to the bit line in response to a first local switch select signal according to operations of the nonvolatile memory apparatus; and
a second local switch block configured to selectively provide the write voltage and the source line voltage to the source line in response to a second local switch select signal according to operations of the nonvolatile memory apparatus,
wherein the first and second local switch select signals are enabled at a logic high level and the first and second local switch select signals are enabled at different voltage levels with each other.

16. The nonvolatile memory apparatus according to claim 15, further comprising:
a first data write/read circuit configured to provide the write voltage, the read voltage, and the source line voltage to the first local switch block in response to a column address signal, a write signal, data, and a read signal; and
a second data write/read circuit configured to provide the write voltage and the source line voltage to the second local switch block in response to the column address signal, the write signal, the data, and the read signal.

17. The nonvolatile memory apparatus according to claim 15, wherein the word line has a first voltage level, and the first and second local switch select signals have one of second and third voltage levels, and
wherein, when the first local switch block provides the write voltage and the read voltage, the first local switch select signal has the second voltage level, and when the first local switch block provides the source line voltage, the first local switch select signal has the third voltage level.

18. The nonvolatile memory apparatus according to claim 17, wherein, when the second local switch block provides the write voltage, the second local switch select signal has the second voltage level, and when the second local switch block provides the source line voltage, the second local switch select signal has the third voltage level.

* * * * *